United States Patent
Kokubun (10) Patent No.: US 11,631,706 B2
(45) Date of Patent: Apr. 18, 2023

(54) LIGHT RECEIVING DEVICE AND SEMICONDUCTOR DEVICE

(71) Applicants: KABUSHIKI KAISHA TOSHIBA, Tokyo (JP); TOSHIBA ELECTRONIC DEVICES & STORAGE CORPORATION, Tokyo (JP)

(72) Inventor: Koichi Kokubun, Yokohama Kanagawa (JP)

(73) Assignees: Kabushiki Kaisha Toshiba, Tokyo (JP); Toshiba Electronic Devices & Storage Corporation, Tokyo (JP)

(*) Notice: Subject to any disclaimer, the term of this patent is extended or adjusted under 35 U.S.C. 154(b) by 259 days.

(21) Appl. No.: 16/997,706

(22) Filed: Aug. 19, 2020

(65) Prior Publication Data
US 2021/0305289 A1 Sep. 30, 2021

(30) Foreign Application Priority Data
Mar. 24, 2020 (JP) .............. JP2020-052687

(51) Int. Cl.
*H01L 27/144* (2006.01)

(52) U.S. Cl.
CPC ...... *H01L 27/1443* (2013.01); *H01L 27/1446* (2013.01)

(58) Field of Classification Search
CPC .......... H01L 27/1443; H01L 27/1446; H01L 27/1463; H01L 21/76224; H01L 31/02027; H01L 31/1075; H01L 31/1804; Y02E 10/547
See application file for complete search history.

(56) References Cited

U.S. PATENT DOCUMENTS

| 7,187,017 B2 | 3/2007 | Sawase et al. |
| 2013/0221196 A1 | 8/2013 | Ohno |
| 2014/0231951 A1 | 8/2014 | Yoon et al. |
| 2018/0269236 A1 | 9/2018 | Sasaki |

(Continued)

FOREIGN PATENT DOCUMENTS

| CN | 1252832 C | * 4/2006 | ....... H01L 21/28123 |
| JP | 2013182893 A | 9/2013 | |

(Continued)

OTHER PUBLICATIONS

H. Finkelstein, M. J. Hsu and S. C. Esener, "STI-Bounded Single-Photon Avalanche Diode in a Deep-Submicrometer CMOS Technology," in IEEE Electron Device Letters, vol. 27, No. 11, pp. 887-889, Nov. 2006, doi: 10.1109/LED.2006.883560. (Year: 2006).*

(Continued)

*Primary Examiner* — Sitaramarao S Yechuri
(74) *Attorney, Agent, or Firm* — Kim & Stewart LLP (57) ABSTRACT

According to one embodiment, a light receiving device, includes pixel regions, each comprising a photoelectric transducer. Each photoelectric transducer is connected to a quenching resistor. A deep trench isolation structure surrounds and separates each pixel region. A plurality of shallow trench isolation portions is in the light receiving device. Each shallow trench isolation portion is below a quenching resistor and on a portion the deep trench isolation structure.

20 Claims, 6 Drawing Sheets

(56) References Cited

U.S. PATENT DOCUMENTS

| | | |
|---|---|---|
| 2018/0301502 A1* | 10/2018 | Lee .................... H01L 27/1463 |
| 2018/0374978 A1 | 12/2018 | Piemonte |
| 2019/0006548 A1* | 1/2019 | Wei .................... H01L 31/1804 |
| 2020/0006410 A1* | 1/2020 | Wu .................... H01L 27/14685 |
| 2020/0212088 A1* | 7/2020 | Kwag ............... H01L 27/14603 |
| 2021/0005651 A1 | 1/2021 | Ohura |
| 2021/0072411 A1* | 3/2021 | McGarvey ........ H01L 27/14636 |
| 2021/0082974 A1 | 3/2021 | Uchida |
| 2021/0272987 A1 | 9/2021 | Masagaki |

FOREIGN PATENT DOCUMENTS

| | | | |
|---|---|---|---|
| JP | 6368894 | B1 | 2/2016 |
| JP | 2016021479 | A | 2/2016 |
| JP | 2018156984 | A | 10/2018 |
| JP | 2019145544 | A | 8/2019 |
| JP | 2019176089 | A | 10/2019 |
| JP | 2020013817 | A | 1/2020 |

OTHER PUBLICATIONS

Japanese Office Action dated Jan. 4, 2023, mailed in counterpart Japanese Application No. 2020-052687, 8 pages (with translation).

\* cited by examiner

LIGHT RECEIVING DEVICE AND SEMICONDUCTOR DEVICE

CROSS-REFERENCE TO RELATED APPLICATION(S)

This application is based upon and claims the benefit of priority from Japanese Patent Application No. 2020-052687, filed on Mar. 24, 2020, the entire contents of which are incorporated herein by reference.

FIELD

Embodiments described herein relate generally to a light receiving device and a semiconductor device.

BACKGROUND

In the related art, a technology of a light receiving device is disclosed in which serially connected sets of a quenching resistor and an avalanche photo diode (APD) are connected in parallel for measuring the number of incident photons on the device. Since the APD used in this context is made of silicon (Si), it is often called a silicon photomultiplier (SiPM).

A SiPM uses a laser diode LD as a light source, and is often adopted in a distance measuring system used to measure a distance to an object.

When measuring the distance with high sensitivity, it is necessary to prevent a crosstalk between adjacent pixels (which in this context are each an APD).

As a result, in order to separate the adjacent pixels to prevent crosstalk, a deep trench isolation (DTI) structure is formed around the pixels and thus serves to define each pixel.

In such a configuration, the DTI structure insulates the quench resistor connected to the APD of the pixel. However, since the area required for the quench resistor is relatively large, the cross-sectional area of the DTI structure correspondingly becomes large as well.

As a result, the effective light receiving area of the APD may be decreased, and thus the sensitivity of the light receiving device may be decreased.

More specifically, for a SiPM in the related art, the sensitivity is significantly decreased due to the decrease in the effective light receiving area of the APD. This is of particular concern in the wavelength range of 800 nm and higher and even more particularly in the wavelength range 900 nm and higher.

DETAILED DESCRIPTION

Embodiments of the present disclosure provide a light receiving device and a semiconductor device capable of separating pixels to decrease crosstalk while preventing a significant decrease in light receiving sensitivity.

In general, according to one embodiment, a light receiving device includes a plurality of pixel regions. Each pixel region comprises a photoelectric transducer. Each photoelectric transducer is connected to a quenching resistor. A deep trench isolation structure surrounds and separates each pixel region of the plurality of pixel regions. A plurality of shallow trench isolation portions is in the light receiving device. Each shallow trench isolation portion is below a quenching resistor and on a portion the deep trench isolation structure.

Hereinafter, descriptions of certain example embodiments of alight receiving device will be made with reference to the drawings. The present disclosure is not limited to these depicted embodiments.

[1] First Embodiment

Figure 1:
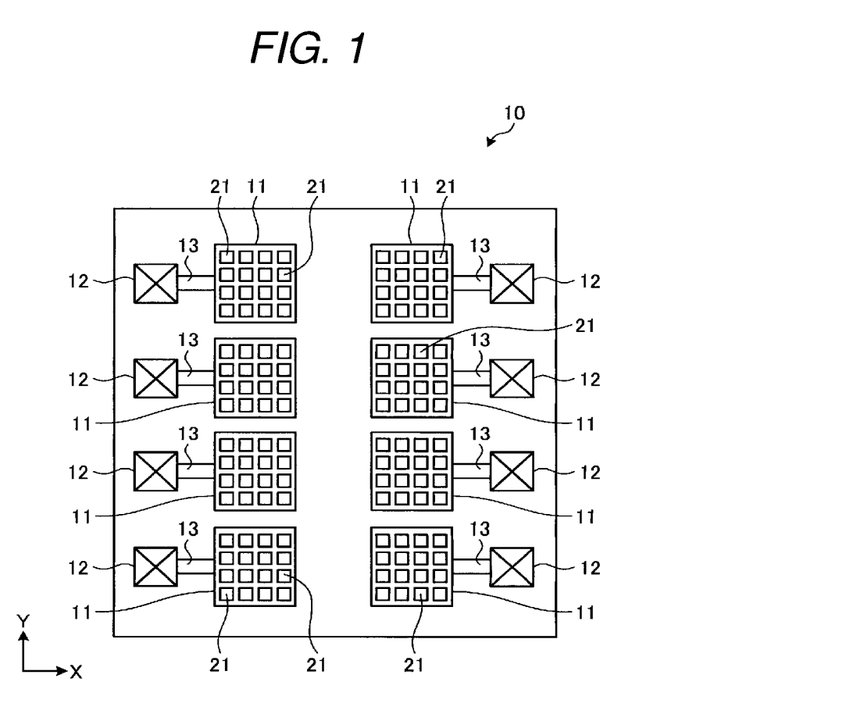
FIG. 1 is a schematic plan view of a light receiving device according to an embodiment.

FIG. 1 is a schematic configuration plan view of a light receiving device according to a first embodiment.

A light receiving device 10 includes a plurality of pixel areas 11. In the pixel areas 11 a plurality of photoelectric transducers 21 are formed on a semiconductor substrate made of silicon. An electrode pad 12 (also referred to as a bonding pad in some contexts) provided for each pixel area 11 A wiring 13 electrically connects the pixel area 11 and the electrode pad 12.

Figure 2:
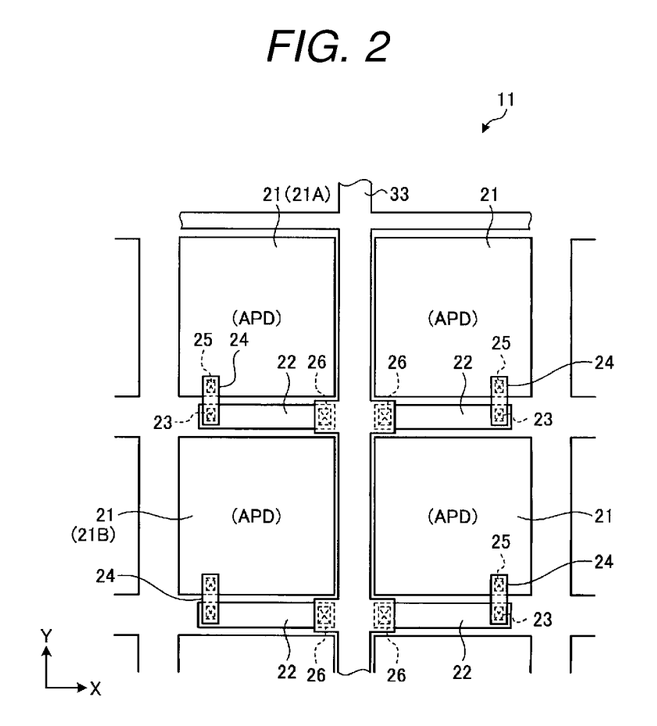
FIG. 2 is a schematic plan view of a part of a pixel area of a light receiving device according to an embodiment.

FIG. 2 is a schematic plan view of a part of a pixel area 11.

In each pixel area 11, a plurality of photoelectric transducers 21 is disposed in a matrix array. Each of the photoelectric transducers 21 is an APD operated in Geiger mode. In Geiger mode, a reverse bias voltage higher than the breakdown voltage is applied between an anode and a cathode of each APD.

A quenching resistor 22 is connected in series with each photoelectric transducer 21. More specifically, one end of a quenching resistor 22 is connected to an anode 25 of the photoelectric transducer 21 via a connecting portion 23 and a wiring 24. The other end of the quenching resistor 22 is connected to an anode wiring 33 via a connecting portion 26.

When photons are incident on the photoelectric transducer 21, and an electron avalanche occurs, the quenching resistor 22 has an effect of terminating the multiplication effect of the photoelectric transducer 21 and extinguishing it by the voltage drop thereof.

In this example, the quenching resistor 22 is made of polycrystalline silicon. The resistance value of the quenching resistor 22 is set to, for example, several hundred kn.

Figure 3:
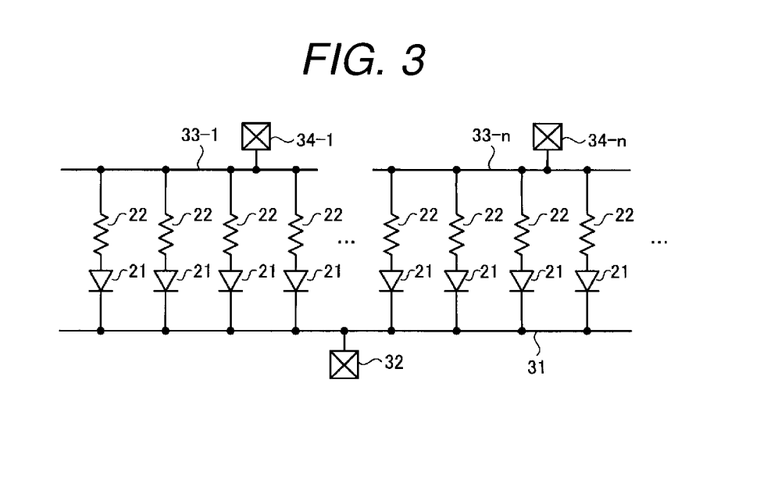
FIG. 3 illustrates an equivalent circuit for apart of a light receiving device according to an embodiment.

FIG. 3 depicts an equivalent circuit of a part of the light receiving device according to the embodiment.

The photoelectric transducers 21 are configured a group of photoelectric transducers 21 is connected to a particular anode line 33-$n$. In FIG. 3, a group of four photoelectric transducers 21 are connected a first anode line 33-1 and another group of four photoelectric transducers 21 are connected to a different anode line (33-$n$). In FIG. 1, sixteen photoelectric transducers 21 are depicted in each pixel area 11. However, the total number of pixels in each pixel area 11 and the number of photoelectric transducers 21 connected to each anode line 33-$n$, is not limited to these examples.

The anodes of the photoelectric transducers 21 that constitute a first group are connected to a first anode wiring 33-1 via respective quenching resistors 22. The first anode wiring 33-1 is electrically connected to a first anode electrode pad 34-1 that corresponds to an electrode pad 12.

The anodes of the photoelectric transducers 21 that constitute an nth (where n is an integer of 2 or more; n=8 in the example in FIG. 1) group are each connected to the nth anode wiring 33-n via respective quenching resistors 22. The nth anode wiring 33-n is electrically connected to the nth anode electrode pad 34-n.

Further, cathodes of the photoelectric transducers 21 that constitute these groups are connected to a common cathode electrode 32 that corresponds to an electrode pad via a cathode wiring 31.

Figure 4:
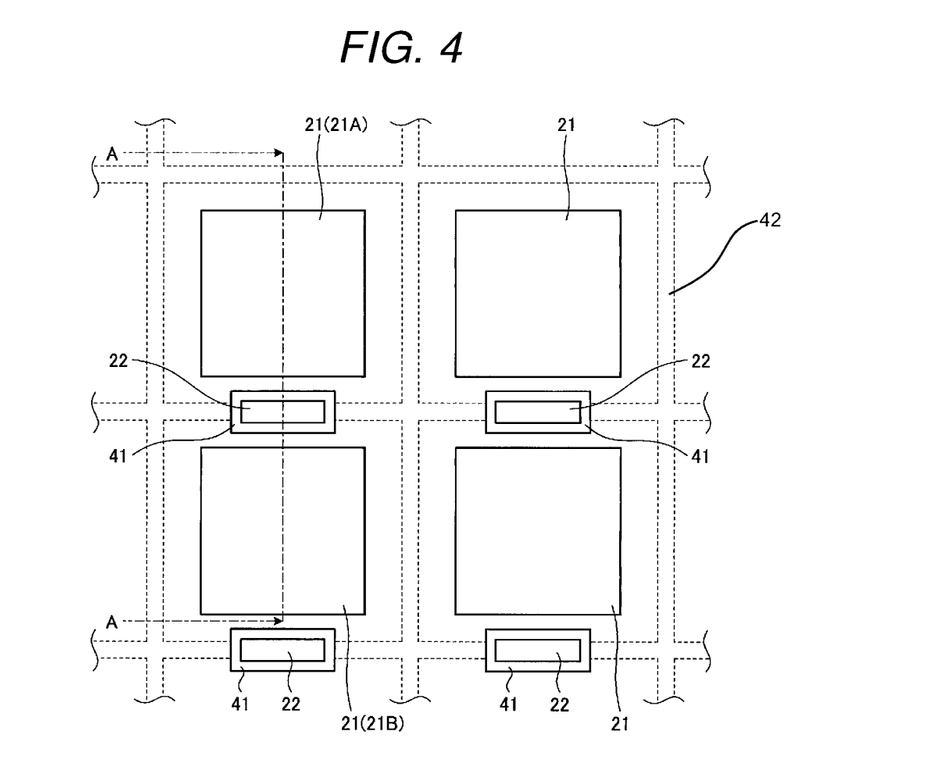
FIG. 4 is a plan view illustrating an internal structure of a light receiving device according to an embodiment.

FIG. 4 is a plan view illustrating an internal structure of the light receiving device according to the first embodiment.

In FIG. 4, for the convenience of understanding, the wiring 24 and the anode wiring 33 are not specifically illustrated.

As illustrated in FIG. 4, a shallow trench isolation (STI) portion 41 is disposed below the quenching resistor 22. A deep trench isolation (DTI) portion 42 is formed in a lattice so as to surround each of the photoelectric transducers 21.

In this case, the shallow trench isolation portion 41 is stacked on the deep trench isolation portion 42. The shallow trench isolation portion 41 is configured such that an orthogonal projection of the shallow trench isolation portion 41 onto a virtual plane including a light receiving surface of the photoelectric transducer 21 includes an orthogonal projection of the quenching resistor 22 onto the virtual plane including the light receiving surface of the photoelectric transducer 21. That is, the planar shape area covered by the quenching resistor 22 is encompassed by the planar shape area of the shallow trench isolation portion 41 when viewed from above (see FIG. 4). As a result, the insulation of the quenching resistor 22 is surely maintained.

Figure 5:
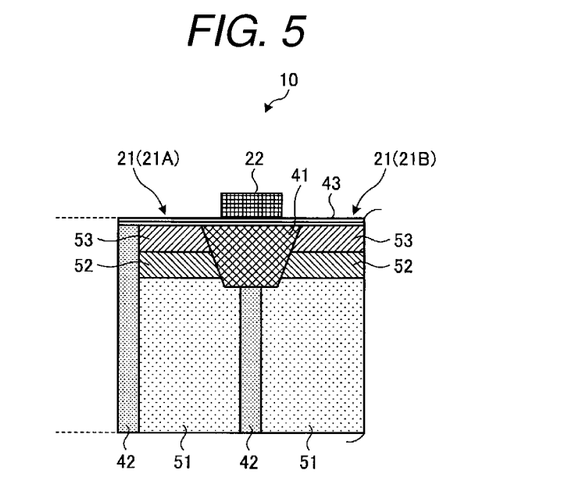
FIG. 5 is a cross-sectional view taken along line A-A in FIG. 4.

FIG. 5 is a cross-sectional view taken along line A-A in FIG. 4.

As illustrated in FIG. 5, the photoelectric transducers 21 (21A and 21B) of the light receiving device 10 are configured as an APD comprising a semiconductor substrate 51 made of P-type silicon, a first epitaxial layer (P+) 52 epitaxially grown on the semiconductor substrate 51, and a second epitaxial layer (N+) 53 epitaxially grown on the first epitaxial layer (P+) 52.

Furthermore, the deep trench isolation portion 42 is provided between the photoelectric transducer 21A and the photoelectric transducer 21B to demarcate them and prevent the occurrence of crosstalk.

Then, the shallow trench isolation portion 41 having an area and a thickness (e.g., a thickness of about 300 nm) necessary to sufficiently insulate the quenching resistor 22 is provided at the upper end of the deep trench isolation portion 42.

Then, the quenching resistor 22 is provided on the upper surface of the shallow trench isolation portion 41 via an oxide insulating film 43.

In order to insulate the quenching resistor 22 with the deep trench isolation portion alone and prevent the crosstalk between the photoelectric transducers 21, the width of the deep trench isolation portion 42 would need to be greater than the width of the quench resistor 21. In such a comparative case, the effective light receiving amount area of the photoelectric transducer 21 would be reduced by the required increased width of the deep trench isolation portion 41, and thus, it is difficult to provide improved sensitivity.

With regard to this, according to the light receiving device 10 of the first embodiment, the width (e.g., 10 μm) of the deep trench isolation portion 42 formed in the semiconductor substrate 51 made of P-type silicon may be set without reference to the width of the quench resistor 21. Therefore, it is possible to expand the effective light receiving area, and to promote improvement of the sensitivity in the wavelength range of 800 nm or more (particularly, 900 nm or more) for which the sensitivity is substantially decreased in the light receiving devices of the comparative example.

In other words, according to the present embodiment, it is possible to widen the light receiving wavelength area while still providing an area in which the quenching resistor 22 can be disposed in a sufficiently insulated state.

Now description of a method for manufacturing a light receiving device of a first embodiment will be provided.

First, the first epitaxial layer (P+) 52 is formed on the surface of the semiconductor substrate 51 by an epitaxial growing method.

The second epitaxial layer (N+) 53 is then formed on the first epitaxial layer (P+) 52.

Subsequently, a first recess portion (a groove portion) corresponding to the deep trench isolation portion 42 is formed by applying a photoresist or the like to the upper surface of the second epitaxial layer (N+) 53, and, after patterning and development, selectively etching the semiconductor substrate 51 to provide the groove portion in the semiconductor substrate 51. Examples of an etching method used in this case may include wet etching using a liquid etchant or chemical dry etching (CDE), such as plasma etching or the like.

The deep trench isolation portion 42 is formed by covering portions other than the now formed groove portion with a photoresist or the like, and, after patterning and development of the resist, forming a silicon insulating film in the groove portion to form the deep trench isolation portions.

Subsequently, a recess portion corresponding to the shallow trench isolation portion 41 is formed by applying a photoresist or the like again, and, after patterning and development, selectively etching the semiconductor substrate 51 and portions of the already formed deep trench isolation portion 42 as need to form the recess portion corresponding to the shallow trench isolation portion 41.

Next, the shallow trench isolation portion 41 is formed by forming a silicon insulating film in the previously formed recess portion.

Subsequently, the quenching resistor 22 is formed on the shallow trench isolation portion 41, and then wiring of an aluminum alloy film is further formed by sputtering.

As described above, it is possible to manufacture a light receiving device with improvements in the sensitivity in the wavelength range of 800 nm or more (particularly, 900 nm or more).

[2] Second Embodiment

Figure 6:
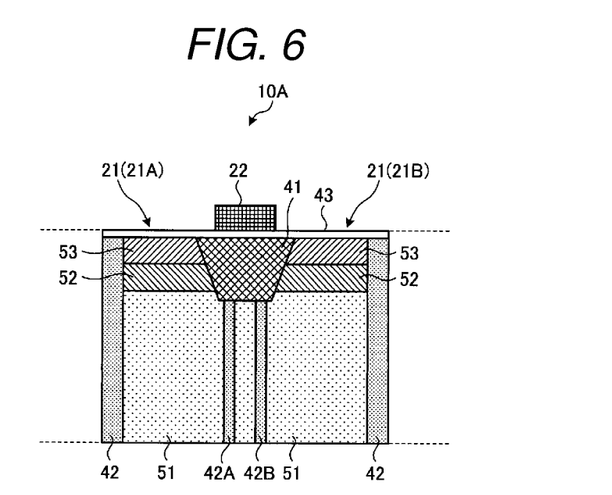
FIG. 6 depicts aspects of a second embodiment.

FIG. 6 depicts aspects of the second embodiment.

In FIG. 6, the same parts as those depicted in and described in conjunction with FIG. 5 are designated by the same reference numerals.

In the first embodiment, the deep trench isolation portion 42 on which the shallow trench isolation portion 41 is stacked is shared by the adjacent photoelectric transducers 21. In the second embodiment, different, separate deep trench isolation portions 42A and 42B are provided for the adjacent photoelectric transducers 21.

Here, the deep trench isolation portion 42A functions as a first deep trench isolation portion 42A that is in contact with the photoelectric transducer 21A. Similarly, the deep trench isolation portion 42B functions as a second deep trench isolation portion 42B that is in contact with the photoelectric transducer 21B.

In the second embodiment, it is possible to expand the practical effective light receiving area while sufficiently decreasing the crosstalk, and to manufacture a light receiving device capable of promoting improvement of the sensitivity in the wavelength range of 800 nm or more (particularly, 900 nm or more).

[3] Third Embodiment

Figure 7:
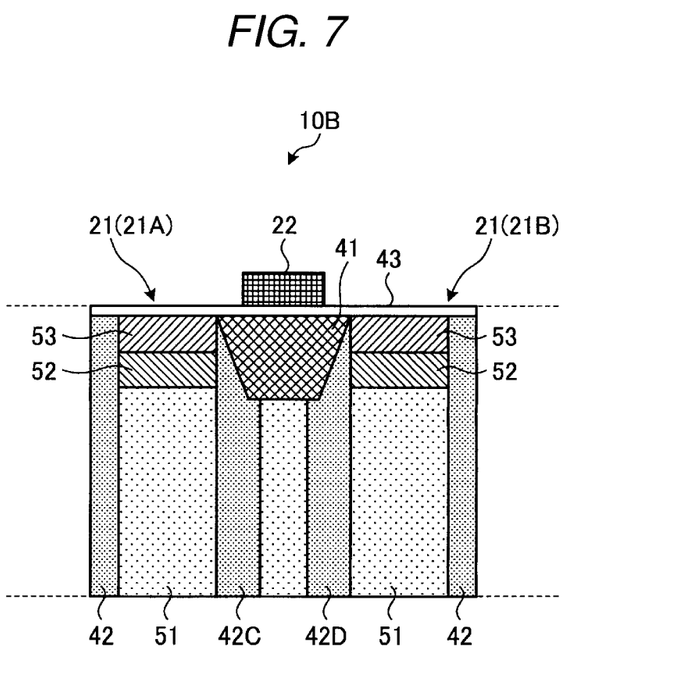
FIG. 7 depicts aspects of a third embodiment.

FIG. 7 depicts aspects of the third embodiment.

In FIG. 7, the same parts as those depicted in and described in conjunction with FIG. 6 are designated by the same reference numerals.

In the second embodiment, the shallow trench isolation portion 41 is stacked on the deep trench isolation portions 42A and 42B. In the third embodiment, the shallow trench isolation portion 41 is embedded between deep trench isolation portions 42C and 42D.

Here, the deep trench isolation portion 42C functions as a first deep trench isolation portion 42C that is in contact with the photoelectric transducer 21A. Similarly, the deep trench isolation portion 42D functions as a second deep trench isolation portion 42D that is in contact with the photoelectric transducer 21B.

Apart of the upper ends of the deep trench isolation portion 42C and the deep trench isolation portion 42D is in contact with the oxide insulating film 43.

Further, the shallow trench isolation portion 41 is embedded between the deep trench isolation portions 42C and 42D. Note, that those deep trench isolation portions 42 on which a shallow trench isolation portion 41 is not formed can correspond in width to those in the first embodiment.

In the third embodiment, it is possible to expand the effective light receiving area while sufficiently decreasing the crosstalk, and to manufacture a light receiving device capable of promoting improvement of the sensitivity in the wavelength range of 800 nm or more (particularly, 900 nm or more).

[4] Fourth Embodiment

The first to third embodiments described above are embodiments in which the light receiving device is configured alone, but the fourth embodiment is a semiconductor device in which a light receiving device and a logic circuit including a CMOS transistor are integrated.

Figure 8:
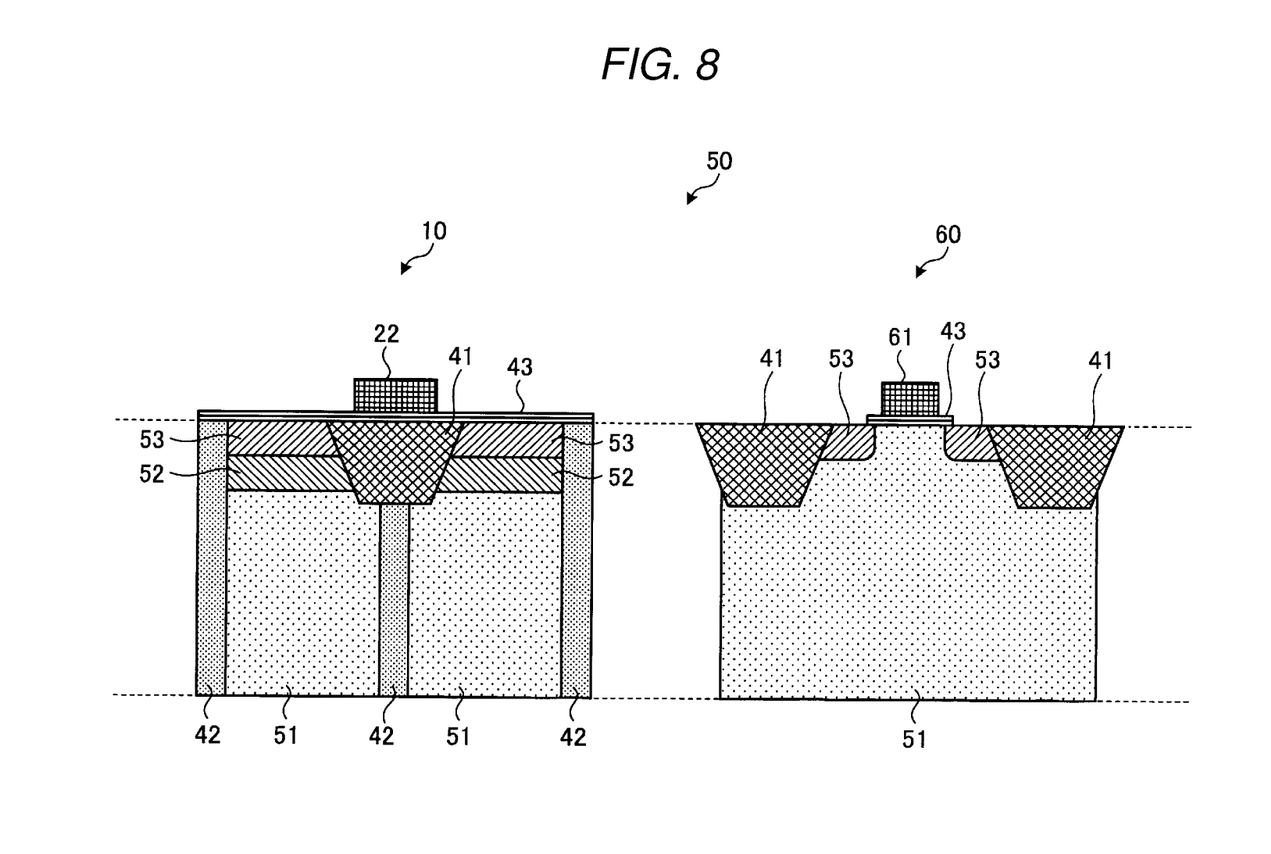
FIG. 8 is a schematic cross-sectional view of a semiconductor device according to a fourth embodiment.

FIG. 8 is a schematic cross-sectional view of a semiconductor device according to the fourth embodiment.

In FIG. 8, the same parts as those in FIG. 5 are designated by the same reference numerals.

A semiconductor device 50 includes the light receiving device 10 and a MOS transistor 60, which in this context is a CMOS transistor.

Since the light receiving device 10 in this example is the same as that of the first embodiment, aspects related MOS transistor 60 will be primarily described.

The MOS transistor 60 includes a portion of the second epitaxial layer (N+) 53 that functions as a source and/or a drain, a portion of the oxide insulating film 43 functions as a gate insulating film, and a gate terminal 61.

In a manufacturing processing of the shallow trench isolation portion 41 as described above, a shallow trench isolation portion 41 that functions as a second shallow trench isolation portion is used as an element separating layer. That is, the second shallow isolation portion can be used to separate various MOS transistors 60 from each other.

Therefore, the shallow trench isolation portion 41 that constitutes the light receiving device 10 and the shallow trench isolation portion 41 that constitutes the MOS transistor 60 have the same configuration and the same composition, which reduces manufacturing complexity.

Thereafter, the oxide insulating film 43 is formed, and then the gate terminal 61 is formed. That is, it is possible to manufacture a logic circuit including a CMOS transistor in parallel with the manufacturing of the light receiving device 10 on the shared semiconductor substrate 51.

Therefore, in addition to the effects of the first embodiment, according to the fourth embodiment, it is possible to more easily manufacture a semiconductor device in which the light receiving device 10 and a logic circuit including a MOS transistor 60 (e.g., a CMOS logic circuit) are integrated.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A light receiving device, comprising:
    a plurality of pixel regions, each pixel region including just one photoelectric transducer, each photoelectric transducer being connected to a quenching resistor;
    a deep trench isolation structure surrounding and separating each pixel region of the plurality of pixel regions; and
    a plurality of shallow trench isolation portions, each shallow trench isolation portion being below a quenching resistor and on a portion the deep trench isolation structure.

2. The light receiving device according to claim 1, wherein a width of the deep trench isolation structure between adjacent pixel regions in a first direction is less than a width of the shallow trench isolation portions in the first direction.

3. The light receiving device according to claim 1, wherein each shallow trench isolation portion extends past the outermost dimensions of the quenching resistor disposed thereon.

4. The light receiving device according to claim 1, wherein the deep trench isolation structure includes:
    a first deep trench isolation portion in contact with a first one of an adjacent pair of pixel regions in the plurality of pixel regions, and
    a second deep trench isolation portion in contact with a second one of the adjacent pair of pixel regions, the first and second deep trench isolation portions being spaced from each other.

5. The light receiving device according to claim 4, wherein a shallow trench isolation portion is embedded between the first deep trench isolation portion and the second deep trench isolation portion.

6. The light receiving device according to claim 1, wherein the just one photoelectric transducer in each pixel region is a single-photon avalanche photodiode and is serially connected to the quenching resistor.

7. A semiconductor device, comprising:
 a light receiving device including:
  a plurality of pixel regions, each pixel region including just one photoelectric transducer, each photoelectric transducer being connected to a quenching resistor;
  a deep trench isolation structure surrounding and separating each pixel region of the plurality of pixel regions; and
  a plurality of first shallow trench isolation portions, each first shallow trench isolation portion being below a quenching resistor and on a portion the deep trench isolation structure; and
 a CMOS logic circuit having MOS transistors separated by a second shallow trench isolation portion having a same structure as the first shallow trench isolation portions.

8. The semiconductor device according to claim 7, wherein the second shallow trench isolation portion has the same composition as the first shallow trench isolation portions.

9. The semiconductor device according to claim 7, wherein a width of the deep trench isolation structure between adjacent pixel regions in a first direction is less than a width of the first shallow trench isolation portions in the first direction.

10. The semiconductor device according to claim 7, wherein each first shallow trench isolation portion extends past the outermost dimensions of the quenching resistor disposed thereon.

11. The semiconductor device according to claim 7, wherein the deep trench isolation structure includes:
 a first deep trench isolation portion in contact with a first one of an adjacent pair of pixel regions in the plurality of pixel regions, and
 a second deep trench isolation portion in contact with a second one of the adjacent pair of pixel regions, the first and second deep trench isolation portions being spaced from each other.

12. The semiconductor device according to claim 11, wherein a first shallow trench isolation portion is embedded between the first deep trench isolation portion and the second deep trench isolation portion.

13. The semiconductor device according to claim 7, wherein the just one photoelectric transducer in each pixel region is a single-photon avalanche photodiode and is serially connected to the quenching resistor.

14. The semiconductor device according to claim 7, wherein
the pixel regions each include a portion of a semiconductor substrate, and
the logic circuit is formed on the semiconductor substrate.

15. A light receiving device, comprising:
 a plurality of pixel regions formed in a semiconductor substrate in a matrix array, each pixel region being spaced from each other pixel region and including just one photoelectric transducer, each photoelectric transducer being connected to a quenching resistor disposed in a region adjacent to the pixel region;
 a deep trench isolation structure formed of an electrically insulating material and surrounding the plurality of pixel regions and being between each adjacent pair of pixel regions in the semiconductor substrate;
 a plurality of shallow trench isolation portions in the semiconductor substrate and formed of an electrically insulating material, each shallow trench isolation portion being below one of the quenching resistors connected to one of the photoelectric transducers and on an upper portion of the deep trench isolation structure; and
 a wiring on an upper surface of the semiconductor substrate, the wiring connecting ends of a group of quenching resistors to an electrode pad.

16. The light receiving device according to claim 15, wherein a width of the deep trench isolation structure between adjacent pixel regions in a first direction is less than a width of the shallow trench isolation portions in the first direction.

17. The light receiving device according to claim 15, wherein each shallow trench isolation portion extends past the outermost dimensions of the quenching resistor disposed thereon.

18. The light receiving device according to claim 15, wherein the deep trench isolation structure includes:
 a first deep trench isolation portion in contact with a first one of an adjacent pair of pixel regions in the plurality of pixel regions, and
 a second deep trench isolation portion in contact with a second one of the adjacent pair of pixel regions, the first and second deep trench isolation portions being spaced from each other by a portion of the semiconductor substrate.

19. The light receiving device according to claim 18, wherein a shallow trench isolation portion is embedded between the first deep trench isolation portion and the second deep trench isolation portion.

20. The light receiving device according to claim 15, wherein the just one photoelectric transducer in each pixel region is a single-photon avalanche photodiode and is serially connected to the quenching resistor.

* * * * *

UNITED STATES PATENT AND TRADEMARK OFFICE
CERTIFICATE OF CORRECTION

| | |
|---|---|
| PATENT NO. | : 11,631,706 B2 |
| APPLICATION NO. | : 16/997706 |
| DATED | : April 18, 2023 |
| INVENTOR(S) | : Koichi Kokubun |

It is certified that error appears in the above-identified patent and that said Letters Patent is hereby corrected as shown below:

On the Title Page

On item (57) Abstract, Line 8, please insert --of-- after "portion".

In the Claims

In Column 6, Claim 1, Line 44, please insert --of-- after "portion".

Signed and Sealed this
Twelfth Day of March, 2024

Katherine Kelly Vidal
*Director of the United States Patent and Trademark Office*